US006979219B2

(12) United States Patent
Scholz

(10) Patent No.: US 6,979,219 B2
(45) Date of Patent: Dec. 27, 2005

(54) ZERO INSERTION FORCE DUAL BEAM SURFACE MOUNT CONTACT

(75) Inventor: James Paul Scholz, Mechanicsburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/840,531

(22) Filed: May 6, 2004

(65) Prior Publication Data

US 2005/0250367 A1    Nov. 10, 2005

(51) Int. Cl.[7] .................................................. H01R 4/50
(52) U.S. Cl. ......................................................... 439/342
(58) Field of Search .............................. 439/342, 259, 439/263, 264, 856, 857, 83, 70, 71, 254

(56) References Cited

U.S. PATENT DOCUMENTS

| 5,256,080 | A |   | 10/1993 | Bright |
| 5,443,591 | A | * | 8/1995 | Tsai ............................ 439/342 |
| 5,667,393 | A | * | 9/1997 | Grabbe et al. .............. 600/443 |
| 6,371,784 | B1 |  | 4/2002 | Scholz et al. |
| 6,450,826 | B1 |  | 9/2002 | Howell et al. |
| 6,482,023 | B1 | * | 11/2002 | Tan ............................ 439/342 |
| 6,824,414 | B2 | * | 11/2004 | Whyne et al. ............... 439/342 |

* cited by examiner

*Primary Examiner*—Alexander Gilman
*Assistant Examiner*—James R. Harvey

(57) ABSTRACT

An electrical contact for a connector includes a contact body that defines a contact plane and a longitudinal contact axis. The contact body includes a contact mounting end for attaching the contact to a circuit board, a mating end to mate with a mating contact, and a backbone section including first and second opposite edges that longitudinally extends between the mating and mounting ends. The mating end includes first and second contact beams laterally extending from the first edge and longitudinally displaced from one another the longitudinal axis.

15 Claims, 5 Drawing Sheets

ZERO INSERTION FORCE DUAL BEAM SURFACE MOUNT CONTACT

BACKGROUND OF THE INVENTION

The invention relates generally to surface mounted connectors on circuit boards, and more specifically to a zero insertion force contact for a grid array connector.

With the ongoing trend toward smaller, faster, and higher performance electrical components such as processors used in computers, it has become increasingly important for other components in the processors' electrical paths to also operate at higher speeds. It is also important that the electrical interfaces connecting the various components to a circuit board become faster. Grid array interfaces, along with surface mount technology, have been developed in response to the need for faster and higher density electrical circuits. As is known in the art, surface mountable packaging allows for the connection of an electronic module, or package, to pads on the surface of the circuit board rather than by contacts or pins soldered in plated holes going through the circuit board.

A Pin Grid Array (PGA) socket has commonly been used for computer processor interfaces. The PGA socket receives pins from the processor and establishes an electrical connection between the processor and a circuit board. The PGA socket may also include a Zero Insertion Force (ZIF) feature that allows the processor pins to be inserted into the socket with little force. Once inserted into the socket, a mechanism on the socket is actuated to move the pins into engagement with the socket contacts to establish an electrical connection.

As computer processors have become more advanced, the pin count of the processors has increased. Current processors have pin arrays with pin counts numbering well into the hundreds. Along with the increased pin count of the processor, the number of socket contacts in the processor socket is also increased. Associated with the increased pin counts, there has been a reduction in pin spacing, and correspondingly, socket contact spacing. Currently, the pin and socket contact spacing on at least some processors has been reduced to a centerline grid having, for example, 0.050 inches between pin and contact ceterlines.

As the number of contact pins increases, the insertion force required to insert the processor into the connector socket also tends to increase. It would therefore be desirable to provide PGA sockets that can accommodate the higher contact densities and continue to provide the ZIF features.

In at least some grid array connectors, single or dual beam contact designs are used wherein the contact beams are formed in a curved geometry over the body of the contact. One drawback in this configuration is that the contact beams, due to their orientation with respect to the contact body, cannot be formed by stamping in a two-piece die. Rather, the beams are shaped in free space which makes dimensions and tolerances difficult to control.

The aforementioned developments and advances present ongoing challenges for both simplified connector designs as well as manufacturing methods that reduce product cost while overcoming the drawbacks with current manufacturing processes.

BRIEF DESCRIPTION OF THE INVENTION

In an exemplary embodiment, an electrical contact for a connector is provided that includes a contact body that defines a contact plane and a longitudinal contact axis. The contact body includes a contact mounting end for attaching the contact to a circuit board, a mating end to mate with a mating contact, and a backbone section including first and second opposite edges that longitudinally extends between the mating and mounting ends. The mating end includes first and second contact beams laterally extending from the first edge and longitudinally displaced from one another along the longitudinal axis.

Optionally, each of the first and second contact beams includes a substantially perpendicular first bend proximate the first edge, a contact tip, and an arcuate section between the contact tip and the first bend. The arcuate section receives the mating contact, and the first bend of the first contact beam is opposite in direction from the first bend of the second contact beam. Further, the arcuate sections of the first and second contact beams receive the mating contact without force. The mating contact is moved in a direction parallel to the contact plane for mechanical and electrical engagement with the contact tip.

In another exemplary embodiment, an electrical contact for a connector is provided that includes a contact body that defines a contact plane and a longitudinal contact axis. The contact body includes a contact mounting end for attaching the contact to a circuit board, a mating end to mate with a mating contact, and a backbone section including first and second opposite edges longitudinally extending between the mating and mounting ends. The mating end includes first and second contact beams laterally extending from the first edge and longitudinally displaced from one another along the longitudinal axis. The first and second contact beams are stamped in the contact plane.

In another exemplary embodiment of the invention, an array socket connector is provided. The connector includes a housing including a plurality of contact chambers and a plurality of electrical contacts, wherein each of the plurailty of contact chambers contains a respective one of the plurality of electrical contact. Each of the electrical contacts include a contact body defining a contact plane and a longitudinal contact axis. The contact body includes a contact mounting end for attaching the contact to a circuit board, a mating end to mate with a mating contact, and a backbone section including first and second opposite edges longitudinally extending between the mating and mounting ends. The mating end includes firs and second contact beams laterally extending from the first edge and longitudinally displaced from one another along the longitudinal axis.

In another exemplary embodiment of the invention, a method of making a contact is provided. The method includes providing a continuous sheet of a conductive material to be fed through a stamping die, stamping the sheet of conductive material to form a linear array of contact blanks between top and bottom carriers, wherein each contact blank includes dual contact beams formed adjacent one another at a common contact edge, and stamping the contact beams to form a first bend adjacent the contact edge, a contact tip, and an arcuate section between the first bend and the contact tip such that the contact beams are offset mirror images of each other.

DETAILED DESCRIPTION OF THE INVENTION

Figure 1:
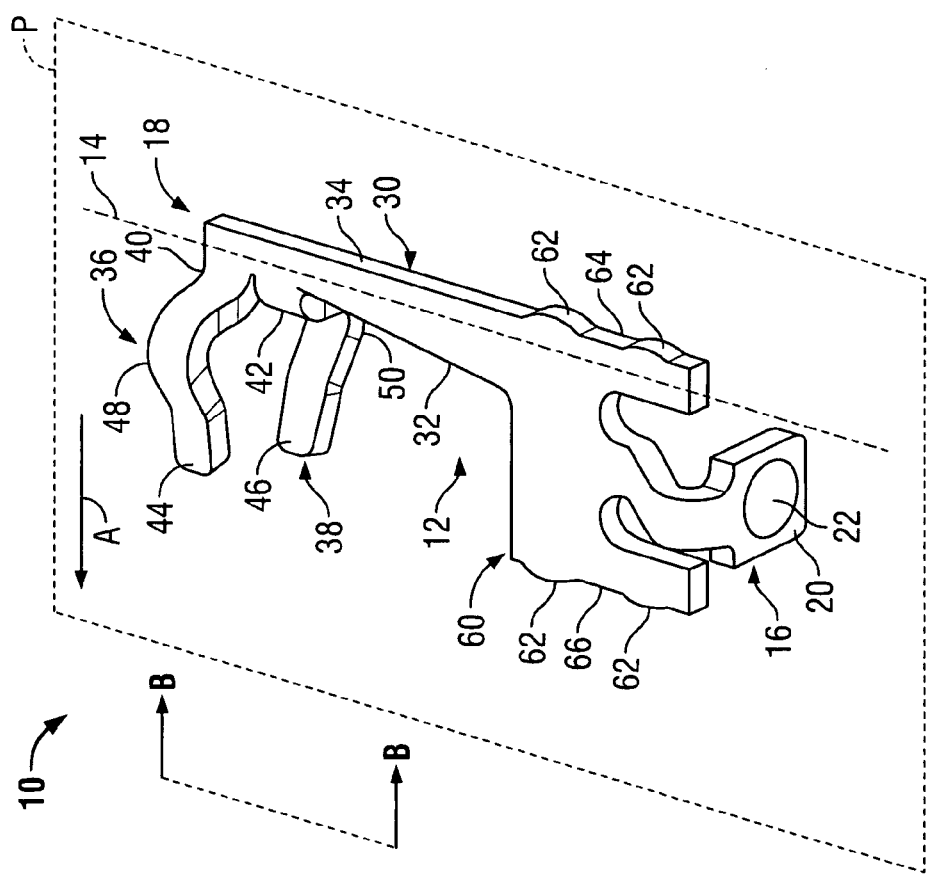
FIG. 1 is a perspective view of an exemplary electrical contact formed in accordance with an embodiment of the present invention.

FIG. 1 illustrates a perspective view of an electrical contact 10 formed in accordance with an exemplary embodiment of the present invention. The contact 10 is a zero insertion force (ZIF) contact adapted for use in an array socket connector such as a micro pin grid array (Micro PGA) connector. It is appreciated, however, that the benefits and advantages of the invention may accrue equally to other types of connectors and sockets across a variety of circuit board connector applications. Therefore, while the invention is described and illustrated in the context of a PGA connector contact 10, the invention is not intended to be limited to such an application, and the description below is therefore provided for purposes of illustration rather than limitation.

As shown in FIG. 1, the contact 10 includes a contact body 12 that defines contact plane P and a longitudinal contact axis 14. The contact body 12 includes a contact mounting end 16 that is provided for attachment of the contact to a circuit board (not shown in FIG. 1), and a mating end 18 to mate with a mating contact (not shown). In an exemplary embodiment, the contact mounting end 16 includes a solder ball paddle 20 that has a dished surface 22 that is configured to hold a solder ball (not shown) to facilitate attachment of the contact 10 to the circuit board by reflow soldering. Alternatively, the contact mounting end 16 can take other known geometries compatible with solder ball attachment or may be provided with attachment pins that are received in mounting holes in the circuit board, particularly at lesser contact densities.

The contact body 12 also includes a backbone section 30 that longitudinally extends along the contact axis 14 between the mating end 18 and the contact mounting end 16. The backbone section 30 includes a first edge 32 and an opposite second edge 34. The mating end 18 includes a first contact beam 36 and an adjacent second contact beam 38, each of which laterally extends from the first edge 32 of the backbone section 30. The second contact beam 38 is longitudinally displaced from the first contact beam 36 along the contact axis 14. The first contact beam 36 is joined to the backbone 30 at a substantially perpendicular first bend 40 at the backbone first edge 32. Similarly, the second contact beam 38 is joined to the backbone 30 at a substantially perpendicular first bend 42 at the backbone first edge 32. The first bend 42 is opposite in direction from that of the first bend 40 of the first contact beam 36. Each contact beam 36 and 38 includes a contact tip 44 and 46 respectively and arcuate sections 48 and 50 respectively, between the first bends 40 and 42 and the contact tips 44 and 46. Arcuate sections 48 and 50 each have opposite curvatures with respect to each other such that the contact beams 36 and 38 are offset mirror images of each other. Neither of the contact beams 36 and 38 includes a portion that is folded back over the backbone section 30 from which the contact beams 36 and 38 extend which allows the contact beams 36 and 38 to be formed in a stamping operation.

Arcuate sections 48 and 50 are adapted to initially receive a mating contact (not shown) without resistance in a ZIF connector socket (not shown). Upon actuation of the ZIF mechanism, the mating contact is moved in the direction of arrow A, in or parallel to the contact plane P, to move the mating contact into engagement with the contact tips 44 and 46 to mechanically and electrically connect the mating contact to the contact 10 and the circuit board. In an exemplary embodiment, the arcuate sections 48 and 50 receive the mating contact without force and therefore can be adapted for use in a ZIF socket. Additionally, the contact beams 36 and 38 are independent of each other and provide a redundancy in the contact 10. Contact beams 36 and 38 are, in the exemplary embodiment, spring beams that flex outwardly substantially perpendicular to the contact plane P when a mating contact engages the contact tips 44 and 46 respectively.

The contact 10 also includes a blade section 60 for mounting the contact 10 in a connector housing (not shown in FIG. 1). The blade section 60 includes a plurality of retaining bumps 62 along side edges 64 and 66 to retain the contact in the housing. The blade section 60 is sized for retention of the contact 10 in the desired housing.

Figure 2:
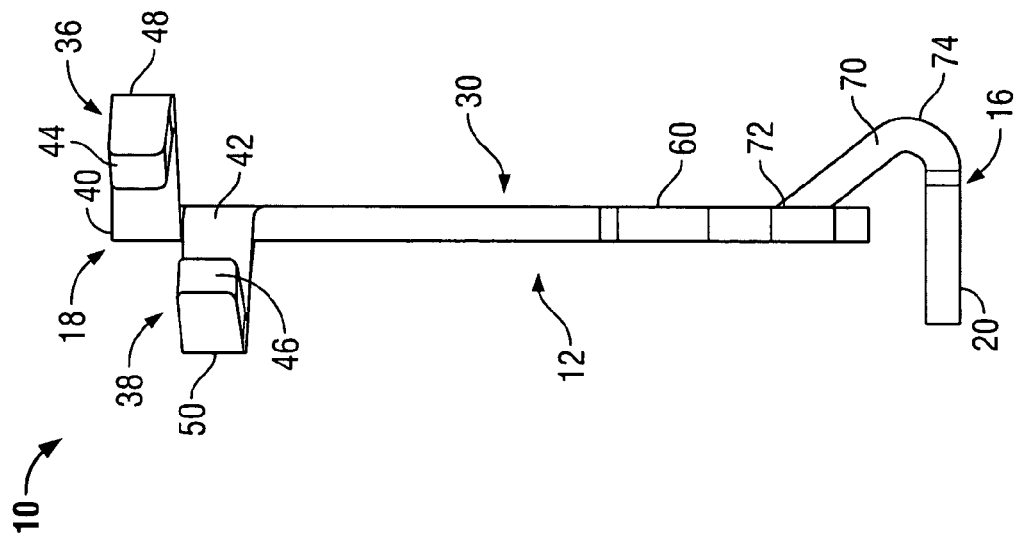
FIG. 2 is a side view of the contact shown in FIG. 1.

FIG. 2 illustrates a side view of the contact 10 taken along sight line B—B and in the contact plane P of FIG. 1. The contact beams 36 and 38 are longitudinally displaced from each other at the mating end 18 of the contact 10 and so oriented, do not directly oppose each other. A stem section 70 joins the solder ball paddle 20 to the blade section 60. As shown in FIG. 2, the stem 70 includes bends 72 and 74 that combine to orient the solder ball paddle 20 substantially perpendicular to the blade section 60 and the backbone 30. In alternative embodiments, the stem section 70 may be formed so that other orientations between the mounting end 16 and the contact body 12 are achieved.

Figure 3:
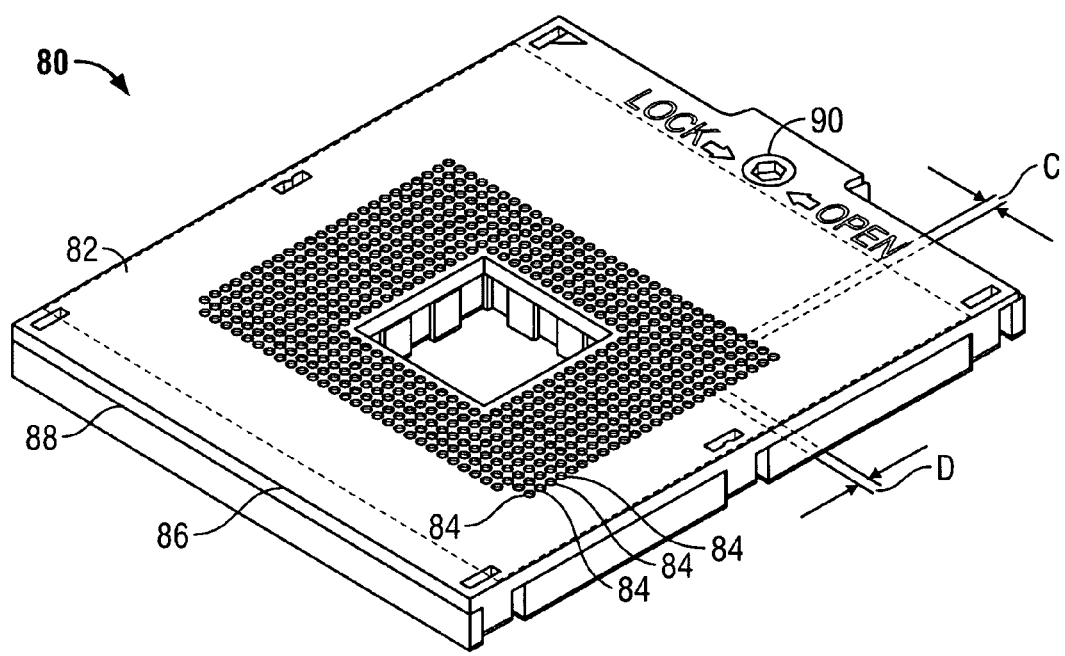
FIG. 3 is a perspective view of an exemplary socket for the contact shown in FIGS. 1 and 2.

FIG. 3 illustrates a perspective view of an exemplary socket 80 with which the contact 10 may be used. The socket 80 includes an insulative cover 82 that includes a plurality of apertures 84 extending through the cover 82. The socket 80 includes a plurality of electrical contacts (not shown) that are housed beneath the cover 82. The cover 82 includes an upper face 86 and a lower face 88. The apertures 84 of the socket 80 are aligned in a fifty by fifty centerline grid, where the distances C and D are each approximately fifty thousandths inches. The socket 80 also includes a ZIF PGA cam mechanism 90.

In operation, the pins of a pin grid array module such as a processor (not shown) are inserted into the corresponding apertures 84 and through the cover 82 of the socket 80 with the apertures providing little or no resistance to the insertion of the module pins. After insertion of the pins, the cam mechanism 90 is operated to move the pins into registry with the contacts (not shown) of the socket 80 to establish mechanical and electrical engagement therewith.

Figure 4:
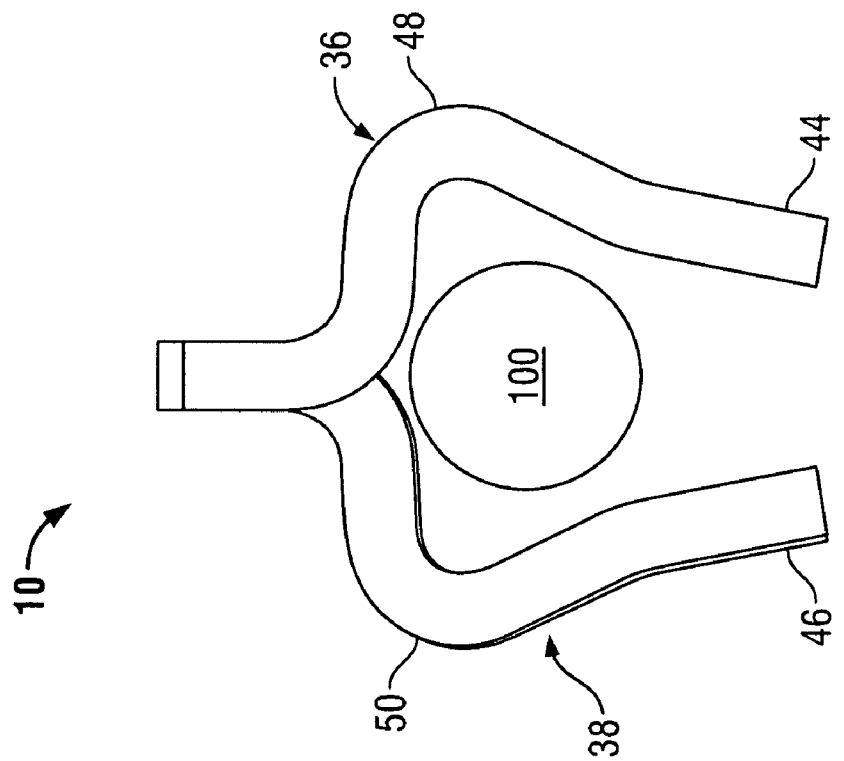
FIG. 4 illustrates a portion of a contact shown in FIGS. 1 and 2 engaging a mating pin without force.

The zero insertion force aspect of the socket 80 with the contact 10 is illustrated with reference to FIGS. 4 and 5. In FIG. 4, a pin contact 100 of a PGA middle (not shown) is received in the arcuate sections 48 and 50 of the contact beams 36 and 38 respectively. In an exemplary embodiment, the contact beams 36 and 38 are sized and contoured so that the pin contact 100 is received in the arcuate sections 48 and 50 without resistance.

Figure 5:
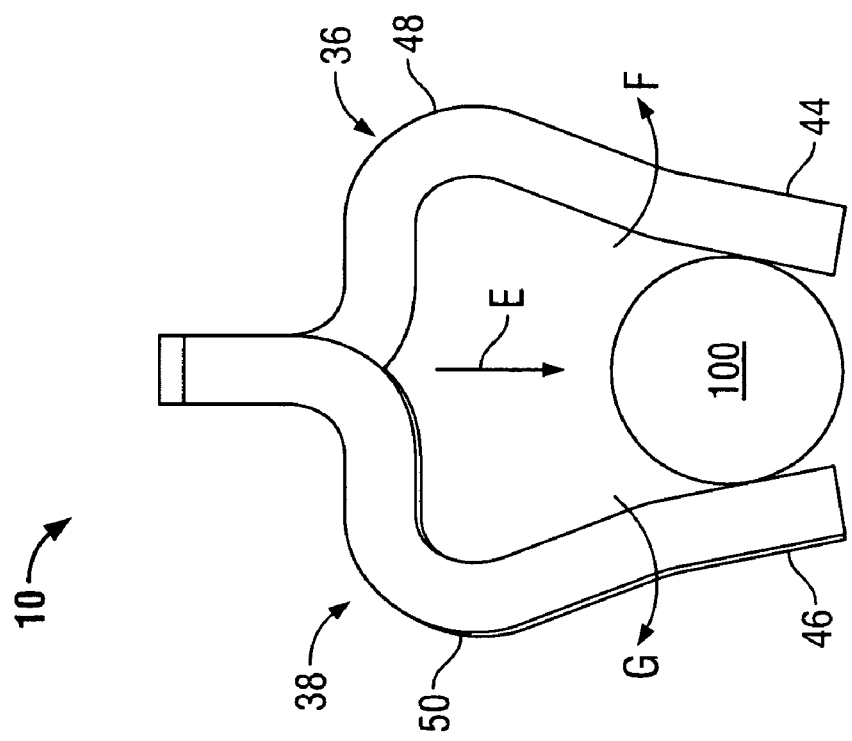
FIG. 5 illustrates the contact shown in FIG. 4 with the mating pin in registry with the contact.

FIG. 5 illustrates the contact 10 after the cam mechanism 90 (see FIG. 3) of the ZIF socket 80 has been operated to move the pin contact 100 into registry with the contact tips 44 and 46 of the contact 10. Operation of the cam mechanism 90 moves the pin contact 100 in the direction of the arrow E which is parallel to the contact plane P (see FIG. 1). In an exemplary embodiment, the contact beams 36 and 38 are flexible spring beams. As the pin contact 100 moves into registry with the contact tips 44 and 46, the contact beams 36 and 38 flex outwardly as indicated by the arrows F and G respectively, to accommodate the pin contact 100. The limit of movement of the pin contact 100 is restricted by the connector housing walls (not shown).

Figure 6:
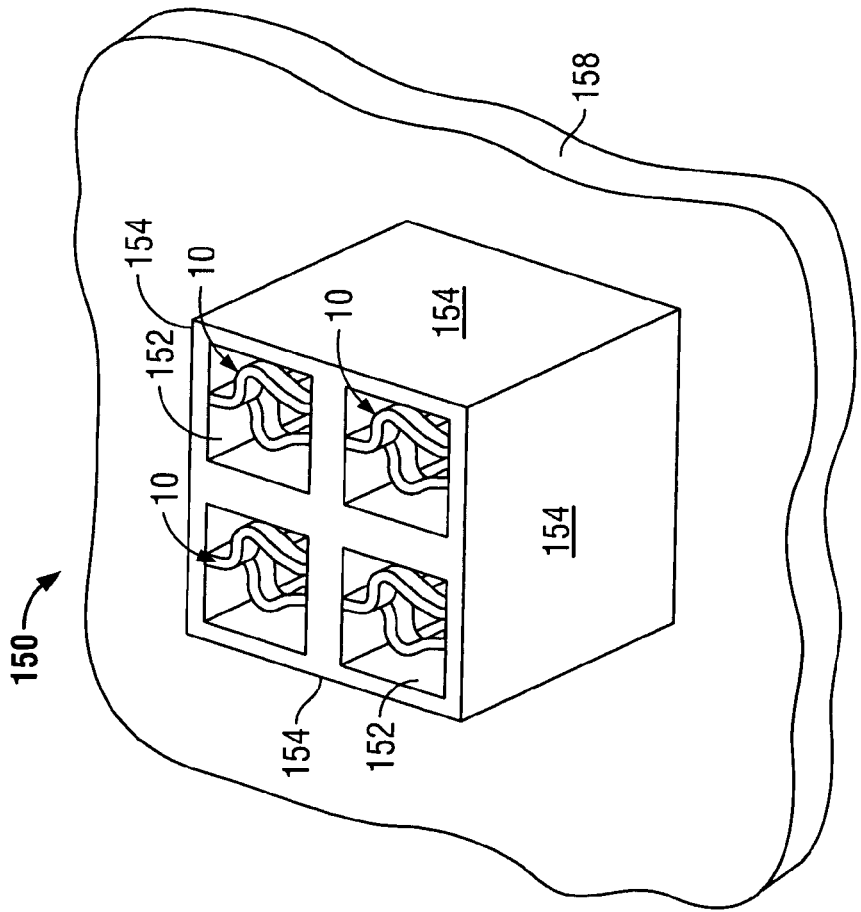
FIG. 6 is a perspective view of a portion of an exemplary socket housing.

FIG. 6 illustrates a portion of a socket such as the ZIF socket 80 (shown in FIG. 3) with the cover removed to reveal a socket housing portion 150. The housing 150 includes a plurality of contact chambers 152 formed within a grid of insulative side walls 154. Each contact chamber 152 includes a contact 10. Each contact 10 in the socket 80 is mounted to a circuit board 158.

Figure 7:
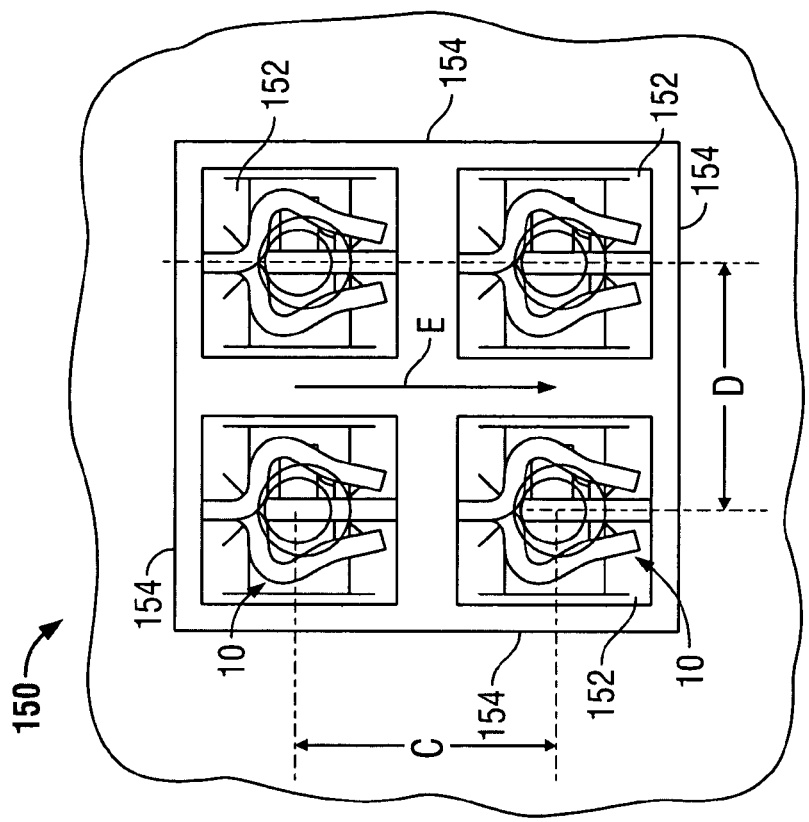
FIG. 7 is a top plan view of the housing portion shown in FIG. 6.

FIG. 7 illustrates a top plan view of the housing portion 150 shown in FIG. 6. Each contact 10 includes a blade section (not shown) that is sized for retention of the contact 10 within the contact chamber 152. The contact 10 is loaded into the contact chamber 152 and oriented so that when a socket cover (not shown in FIG. 7) is installed over the housing 150, the movement of the cover in response to actuation of the cam mechanism 90 (see FIG. 3) is parallel to the plane P (see FIG. 1) of the contact 10.

Figure 8:
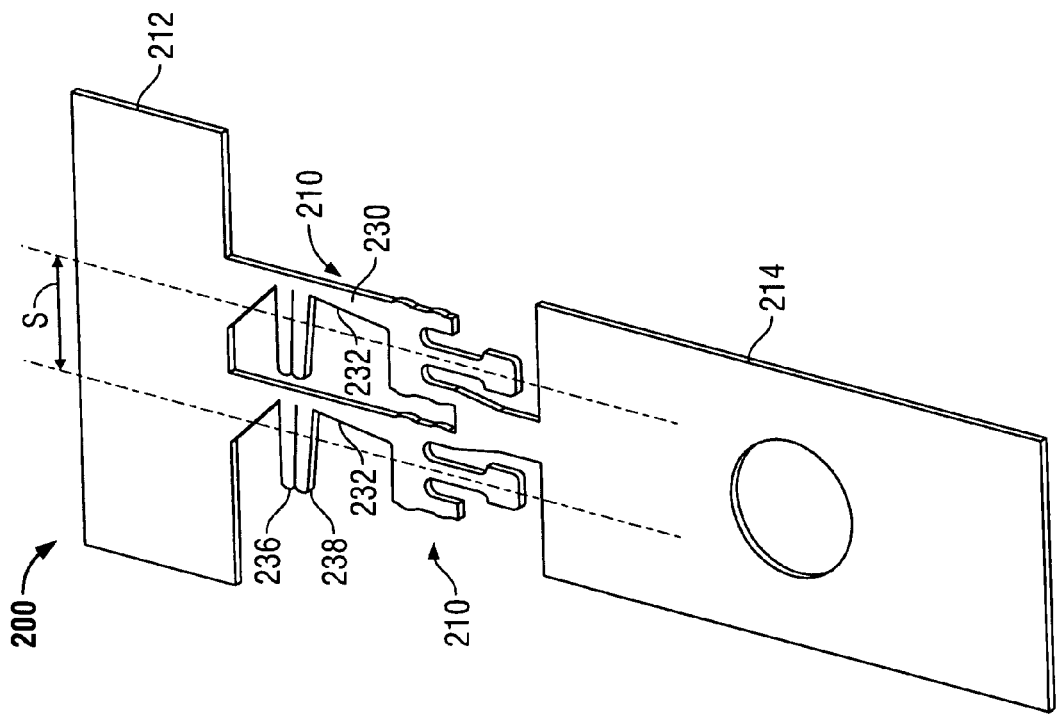
FIG. 8 is a perspective view of the contact shown in FIG. 1 in a first stage of manufacture.

The fabrication of the contact 10 will be described with reference to FIGS. 8 and 9. FIG. 8 is a perspective view illustrating the contact 10 at a first stage of manufacture. Fabrication of the contact 10 is accomplished by providing a continuous sheet of conductive material 200 that can be fed through stamping dies (not shown). In a first stamping operation, the sheet of conductive material 200 in punched as it passes through a die to form a series or linear array of contact blanks 210 between top and bottom carriers 212 and 214 respectively. Each contact blank 210 is formed with a backbone section 230 that has a first edge 232. Dual contact beams 236 and 238 are formed adjacent one another at the first contact edge 232. The contact beams 236 and 238 extend side by side in the same direction which allows the contact blanks 210 to be positioned closer together than would be possible if the contact beams 236 and 238 opposed each other. In an exemplary embodiment, the contact blanks 210 are formed with a centerline spacing S of fifty thousandths inches. This compressed spacing of the blanks 210 reduces material costs and also reduces plating costs.

After forming the blanks 210, the final contour of the contact beams 236 and 238 is applied and is also accomplished by stamping the contact beams 236 and 238 which represents an additional advantage from the orientation of the contact beams 236 and 238. By contrast, in conventional contact designs wherein contact arms fold over a contact body, the contact arms are typically formed by bending or shaping the contact arm in free space. Stamping of the contact beams 236 and 238 in the die (not shown) allows for more precise control of tolerances and allows the contact 210 to be more consistently formed. In an exemplary embodiment, the solder ball paddle 220 may also be stamped simultaneously with the stamping of the contact beams 236 and 238.

Figure 9:
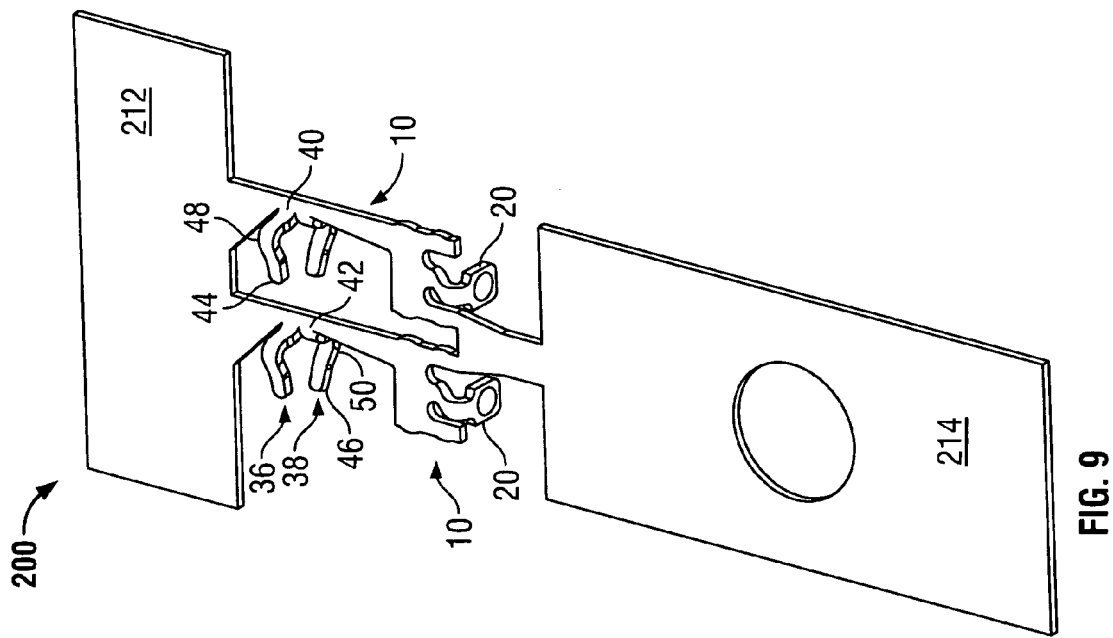
FIG. 9 is a perspective view of the contact shown in FIG. 1 in a second stage of manufacture.

FIG. 9 illustrates the contact 10 in a second stage of manufacture. In FIG. 9, each contact 10 includes completed contact beams 36 and 38 and solder ball paddle 20. Each contact beam 36 and 38 is formed with first bends 40 and 42, formed contact tips 44 and 46 and an arcuate sections 48 and 50 therebetween. The contact beams 36 and 38 are offset mirror images of each other. In the next step in the fabrication process, the contact 10 undergoes a plating operation, after which the completed contact 10 is separated from the carriers 212 and 214.

The embodiment thus described provide a zero insertion force contact that can be used in a grid array connector at a fifty thousandths centerline pitch. The contact has dual split contact beams for redundancy. Both contact beams extend laterally from a common contact edge which allows the contact beams to be stamped and formed with greater precision in a two-piece die set as the contact body is formed. The orientation of the contact beams also allows the contacts to be formed on the carrier at a fifth thousandths centerline spacing which reduces material costs and manufacturing costs.

While the invention has been described in terms of various specific embodiments, those skilled in the art will recognize that the invention can be practiced with modification within the spirit and scope of the claims.

What is claimed is:

1. An electrical contact for a connector comprising:
   a contact body, said contact body defining a contact plane and a longitudinal contact axis, said contact body comprising a contact mounting end for attaching said contact to a circuit board, a mating end to mate with a mating contact, and a backbone section including first and second opposite edges longitudinally extending between said mating and mounting ends, said mating end including first and second contact beams laterally extending from said first edge and longitudinally displaced from one another along said longitudinal axis; and
   wherein each said first and second contact beams include a substantially perpendicular first bend proximate said first edge, a contact tip, and an arcuate section between said contact tip and said first bend, said arcuate sections receiving said mating contact, and wherein said first bend of said first contact beam is opposite in direction from said first bend of said second contact beam.

2. The contact of claim 1 wherein said arcuate sections receive said mating contact without resistance.

3. The contact of claim 1 wherein said arcuate sections receive said mating contact without resistance, and said mating contact is moved in a direction parallel to said contact plane for mechanical and electrical engagement with said contact tips.

4. The contact of claim 1 wherein said contact body further comprises a blade section including at least one retaining bump for retaining said contact in a housing.

5. The contact of claim 1 wherein said mounting end includes a solder ball paddle for retaining a solder ball for attachment of said contact to the circuit board.

6. The contact of claim 1 wherein said contact body further comprises a blade section including at least one retaining bump for retaining said contact in a housing and a stem section joining said mounting end to said blade section, said mounting end including a solder ball paddle, said stem section including a bend to orient said solder ball paddle substantially perpendicular to said blade section.

7. An electrical contact for a connector comprising:
   a contact body, said contact body defining a contact plane and a longitudinal contact axis, said contact body comprising a contact mounting end for attaching said contact to a circuit board, a mating end to mate with a mating contact, and a backbone section including first and second opposite edges longitudinally extending between said mating and mounting ends, said mating end including first and second contact beams laterally extending from said first edge and longitudinally displaced from one another along said longitudinal axis, and wherein said first and second contact beams are stamped in said contact plane; and wherein each said first and second contact beams includes a substantially perpendicular first bend proximate said first edge, a contact tip, and an arcuate pin receiving section between said contact tip and first bend, and wherein said first bend of said first contact beam is opposite in direction from said first bend of said second contact beam.

8. The contact of claim 7 wherein said arcuate sections receive said mating contact without resistance.

9. The contact of claim 7 wherein said arcuate sections receive said mating contact without resistance, and said mating contact is moved in a direction parallel to said contact plane for mechanical and electrical engagement with said contact tips.

10. The contact of claim 7 wherein said contact body further comprises a blade section including at least one retaining bump for retaining said contact in a housing.

11. The contact of claim 7 wherein said mounting end includes a solder ball paddle for retaining a solder ball for attachment of said contact to the circuit board.

12. An array socket connector comprising:
a housing comprising a plurality of contact chambers;
a plurality of electrical contacts, each of said plurality of contact chambers containing a respective one of said plurality of electrical contacts, wherein each said electrical contact comprises a contact body, said contact body defining a contact plane and a longitudinal contact axis, said contact body comprising a contact mounting end for attaching said contact to a circuit board, a mating end to mate with a mating contact, and a backbone section including first and second opposite edges longitudinally extending between said mating and mounting ends, said mating end including first and second contact beams laterally extending from said first edge and longitudinally displaced from one another along said longitudinal axis; and wherein each said first and second contact beams includes a substantially perpendicular first bend proximate said first edge, a contact tip, and an arcuate section between said contact tip and said first bend, said arcuate sections receiving said mating contact, and wherein said first bend of said first contact beam is opposite in direction from said first bend of said second contact beam, said arcuate sections receiving said mating contact without resistance.

13. The socket connector of claim 12 wherein said arcuate sections receive said mating contact without resistance, and said mating contact is moved in a direction parallel to said contact plane for mechanical and electrical engagement with said contact tips.

14. The socket connector of claim 12 wherein said contact body further comprises a blade section including at least one retaining bump for retaining said contact in said housing.

15. The socket connector of claim 12 wherein said mounting end includes a solder ball paddle for retaining a solder ball for attachment of said contact to the circuit board.

* * * * *